(12) United States Patent
Kuo et al.

(10) Patent No.: US 12,170,241 B2
(45) Date of Patent: Dec. 17, 2024

(54) EMBEDDED METAL INSULATOR METAL STRUCTURE

(71) Applicant: TAIWAN SEMICONDUCTOR MANUFACTURING CO., LTD., Hsinchu (TW)

(72) Inventors: Feng-Wei Kuo, Hsinchu (TW); Wen-Shiang Liao, Miaoli (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/837,517

(22) Filed: Jun. 10, 2022

(65) Prior Publication Data
US 2022/0301994 A1 Sep. 22, 2022

Related U.S. Application Data

(62) Division of application No. 16/690,535, filed on Nov. 21, 2019, now Pat. No. 11,362,026.
(Continued)

(51) Int. Cl.
*H01L 21/02* (2006.01)
*H01L 21/3105* (2006.01)
(Continued)

(52) U.S. Cl.
CPC .......... *H01L 23/49589* (2013.01); *H01L 21/02422* (2013.01); *H01L 21/31055* (2013.01); *H01L 21/76832* (2013.01); *H01L 23/29* (2013.01); *H01L 23/49827* (2013.01); *H01L 23/5223* (2013.01); *H01L 24/05* (2013.01);
(Continued)

(58) Field of Classification Search
None
See application file for complete search history.

(56) References Cited

U.S. PATENT DOCUMENTS

2016/0133686 A1  5/2016  Liao et al.
2016/0147088 A1*  5/2016  Jou ..................... G02B 6/4274
385/2
(Continued)

FOREIGN PATENT DOCUMENTS

DE   102018207217 A1   5/2019
KR   20160089883 A     7/2016
KR   20190055701 A     5/2019

*Primary Examiner* — Sarah K Salerno
(74) *Attorney, Agent, or Firm* — Sterne, Kessler, Goldstein & Fox P.L.L.C.

(57) ABSTRACT

The present disclosure is directed to a method for forming metal insulator metal decoupling capacitors with scalable capacitance. The method can include forming a first redistribution layer with metal lines on a portion of a polymer layer, depositing a photoresist layer on the first redistribution layer, and etching the photoresist layer to form spaced apart first and second TIV openings in the photoresist layer, where the first TIV opening is wider than the second TIV opening. The method can further include depositing a metal in the first and second TIV openings to form respective first and second TIV structures in contact with the metal line, removing the photoresist layer, forming a high-k dielectric on a top surface of the first and second TIV structures, and depositing a metal layer on the high-k dielectric layer to form respective first and second capacitors.

20 Claims, 18 Drawing Sheets

Related U.S. Application Data

(60) Provisional application No. 62/877,638, filed on Jul. 23, 2019.

(51) Int. Cl.
  *H01L 21/768* (2006.01)
  *H01L 23/00* (2006.01)
  *H01L 23/29* (2006.01)
  *H01L 23/495* (2006.01)
  *H01L 23/498* (2006.01)
  *H01L 23/522* (2006.01)
  *H01L 49/02* (2006.01)

(52) U.S. Cl.
  CPC .............. *H01L 24/11* (2013.01); *H01L 28/40* (2013.01); *H01L 28/60* (2013.01); *H01L 2224/02331* (2013.01); *H01L 2224/02372* (2013.01); *H01L 2924/19041* (2013.01)

(56) References Cited

U.S. PATENT DOCUMENTS

| | | |
|---|---|---|
| 2019/0139911 A1 | 5/2019 | Gutierrez, III et al. |
| 2019/0148274 A1 | 5/2019 | Yu et al. |
| 2019/0157108 A1* | 5/2019 | Liao .................... H01L 21/486 |
| 2020/0135840 A1 | 4/2020 | Chen et al. |

* cited by examiner

100

```
┌─────────────────────────────────────────────────────┐
│ Provide a glass carrier substrate with a polymer layer │ — 110
└─────────────────────────────────────────────────────┘
                          ▼
┌─────────────────────────────────────────────────────┐
│   Form a bottom redistribution layer (RDL) on the    │ — 120
│                    polymer layer                     │
└─────────────────────────────────────────────────────┘
                          ▼
┌─────────────────────────────────────────────────────┐
│   Form through interposer vias (TIVs) in contact with │ — 130
│                    the bottom RDL                    │
└─────────────────────────────────────────────────────┘
                          ▼
┌─────────────────────────────────────────────────────┐
│           Attach a die on the polymer layer          │ — 140
└─────────────────────────────────────────────────────┘
                          ▼
┌─────────────────────────────────────────────────────┐
│  Dispose a molding compound on the polymer layer     │ — 150
│         to surround the die and the TIVs             │
└─────────────────────────────────────────────────────┘
                          ▼
┌─────────────────────────────────────────────────────┐
│ Form a high-k dielectric on the molding compound,    │ — 160
│              the TIVs, and the die                   │
└─────────────────────────────────────────────────────┘
```

Fig. 1A

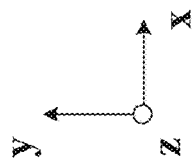
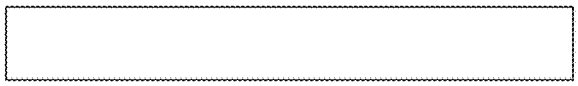
FIG. 16C
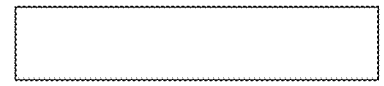
FIG. 16F
FIG. 16B
FIG. 16E
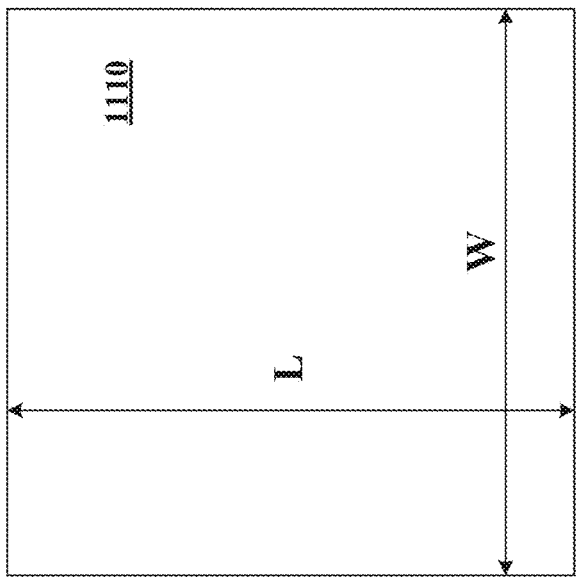
FIG. 16A
FIG. 16D

EMBEDDED METAL INSULATOR METAL STRUCTURE

CROSS-REFERENCE TO RELATED APPLICATIONS

The present application is a divisional of U.S. Nonprovisional patent application Ser. No. 16/690,535, filed on Nov. 21, 2019, titled "Embedded Metal Insulator Metal Structure," which claims the benefit of U.S. Provisional Patent Application No. 62/877,638, filed on Jul. 23, 2019, titled "Decoupling Capacitors with Tunable Capacitance." The contents of the aforementioned applications are incorporated by reference herein in their entireties.

BACKGROUND

Decoupling capacitors can be built into a chip to prevent voltage spikes in a power supply, such as when the chip is initially powered or when various components of the chip are activated. In the chip fabrication process, decoupling capacitors can be integrated in the far back end of the line during or after packaging of the chip.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 1A and 1B are a flow chart of a fabrication method for forming metal insulator metal (MIM) capacitors with scalable capacitance in an integrated fan-out (InFO) packaging structure, according to some embodiments.

FIGS. 16A-F and 17A-F are plan views of exemplary shapes of metal insulator metal (MIM) capacitors with scalable capacitance, according to some embodiments.

DETAILED DESCRIPTION

Figure 1B:
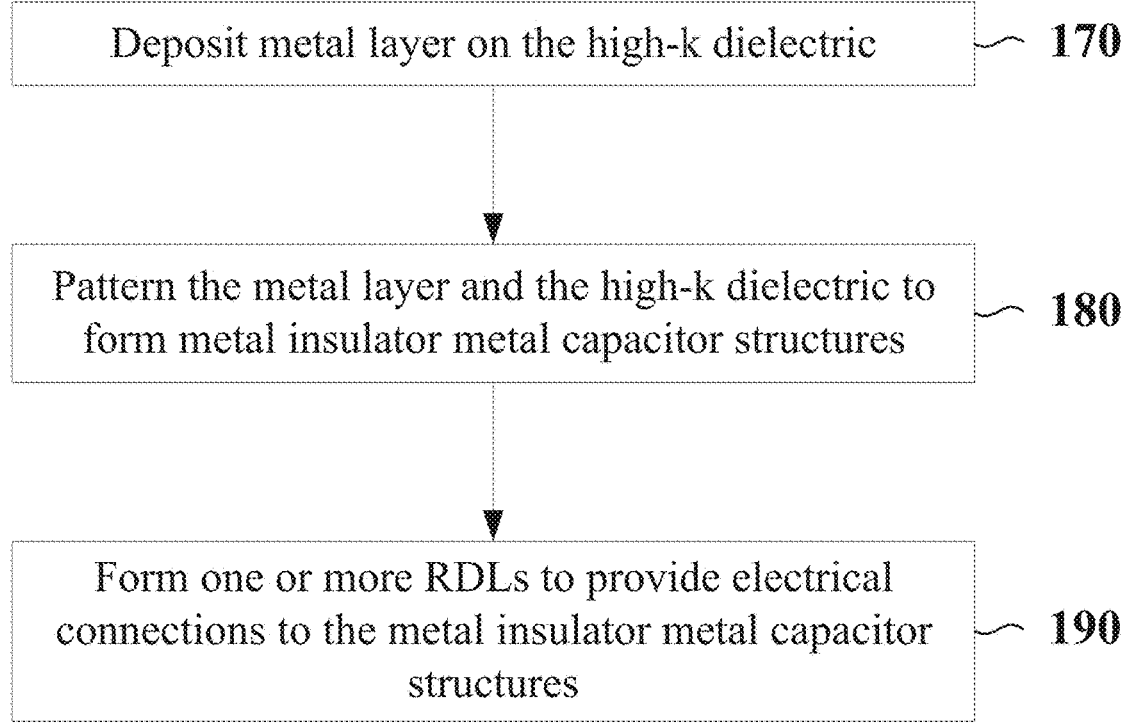

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

The term "vertical," as used herein, means nominally perpendicular to the surface of a substrate.

Decoupling capacitors (DeCAP) can be built into a chip to prevent voltage spikes in a power supply, such as when the chip is initially powered or when various components of the chip are activated. Since the power supply cannot instantaneously respond to such power demand changes, the chip's power voltage can change for a brief period until the power supply can respond and stabilize the voltage. Voltage spikes may occur during this transient time. Decoupling capacitors can suppress these voltage spikes. Decoupling capacitors with higher capacitance can further suppress the voltage spikes.

In a chip fabrication process, decoupling capacitors can be integrated in the far back-end-of the-line (BEOL) during or after packaging of the chip. Decoupling capacitors, for example, can be surface mounted onto a packaging substrate using a surface-mount technology (SMT). However, SMT requires external interconnects between the packaging substrate and the decoupling capacitors, which are mounted externally. The external interconnects or connections can increase time delay, such as the delay between a spike occurrence and spike suppression. The embodiments described herein are directed to a method for forming decoupling capacitors that can be integrated into a 3D integrated circuit (IC) packaging, such as a chip-on-wafer-on-substrate (CoWoS) chip package or an integrated fan-out (InFO) chip package. Integrating the decoupling capacitor into the 3D IC packaging has the benefit of internal interconnects, which can be shorter than external interconnects. CoWoS and InFO chip packages can integrate multiple functional dies onto an interposer with a space allocated between each die so that input/output (I/O) connection points can be formed. In some embodiments, the decoupling capacitors formed as part of interposer of CoWoS and InFO chip packages are metal insulator metal (MIM) structures that can include a high dielectric constant (high-k) material (e.g., with a dielectric constant greater than about 3.9). Compared to decoupling capacitors mounted on substrates using the SMT technology, an integrated MIM capacitor—according to embodiments described herein—can (i) reduce time delay due to a shorter interconnect length, (ii) have a higher capacitance and a larger capacitance range, (iii) reduce power consumption, (iv) improve operational speed, and (v) reduce the packaging footprint.

FIGS. 1A and 1B show a flow chart of a method 100 that forms MIM decoupling capacitors with "scalable" capacitance embedded in an InFO 3D IC packaging, according to some embodiments. The MIM decoupling capacitors fabricated with method 100 can be formed with different surface areas to provide a wide range of capacitances for power management and radio frequency (RF) components. For example, MIM decoupling capacitors fabricated with method 100 can have capacitances ranging from the femto Farad (fF) range to the nano Farad (nF) range. Other fabrication operations may be performed between the various operations of method 100 and may be omitted merely for clarity. For example purposes, method 100 will be described in the context of InFO 3D IC packaging. However, method 100 can be also applied to other types of packaging, such as CoWoS 3D IC packaging. These other types of packaging are within the spirit and scope of this disclosure.

Method 100 will be described with respect to FIGS. 2-17. FIG. 2-17 used herein are for illustrative purposes only and are not to scale. In addition, FIG. 2-17 may not reflect the actual geometry of the real structures, features, or layers. Some structures, layers, or geometries may have been deliberately augmented or omitted for illustrative and clarity purposes.

Figure 2:
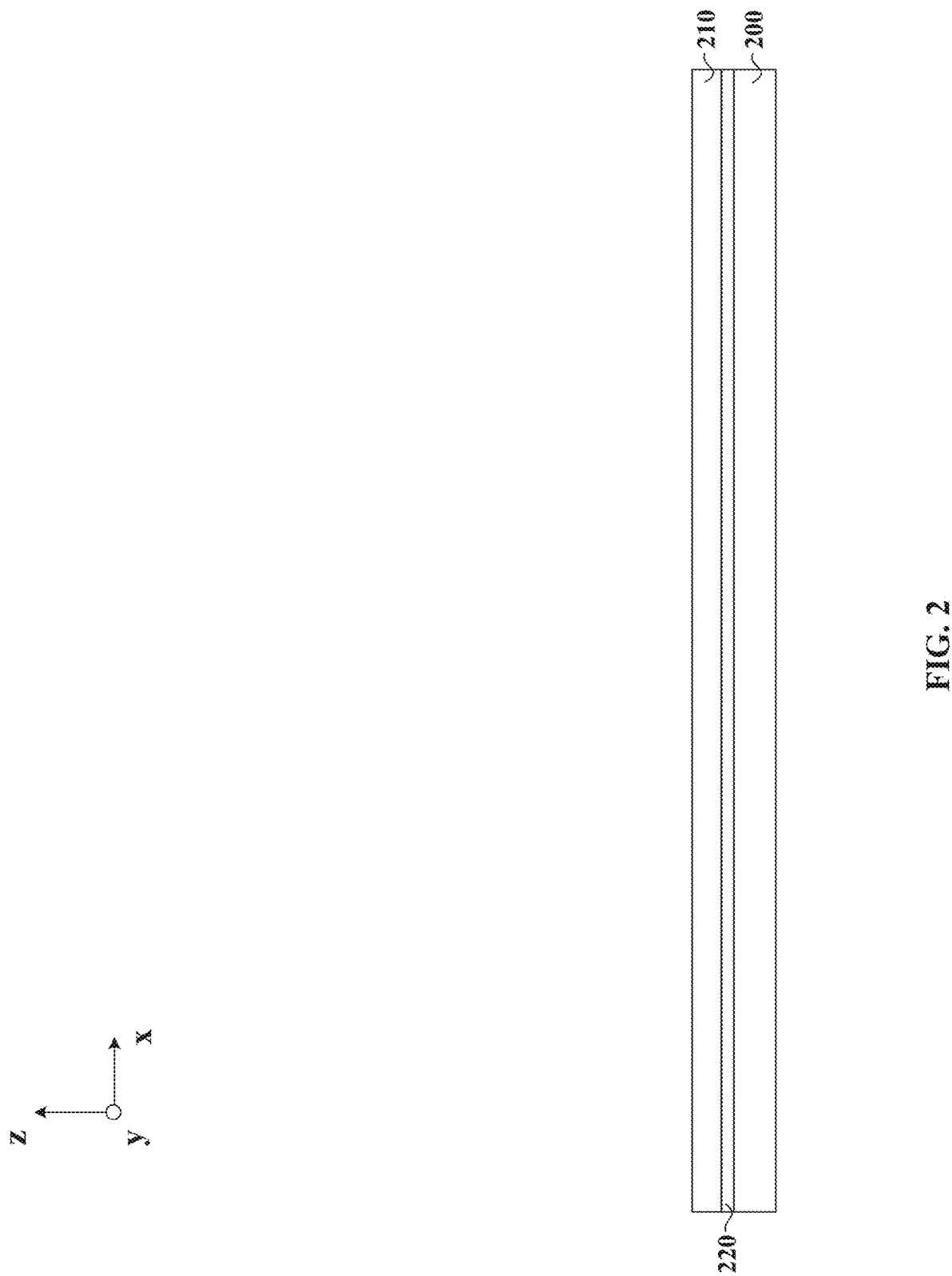
FIGS. 2-15 are cross-sectional views and plan views of an integrated fan-out (InFO) packaging structure during various fabrication operations for forming metal insulator metal (MIM) capacitors with scalable capacitance, according to some embodiments.

Referring to FIG. 1A, exemplary fabrication method 100 begins with operation 110, where a glass carrier substrate 200 is provided with a protective layer 210 thereon, as shown in FIG. 2. In some embodiments, glass carrier substrate 200 provides mechanical support to structural elements attached or fabricated in subsequent operations of method 100. By way of example and not limitation, protective layer 210 can include a polyimide (PI), a polybenzoxazole (PBO), or another suitable polymer material. In some embodiments, protective layer 210 (also referred to herein as "polymer layer 210") is a stress relief coating used as a protective layer or a "buffer coat" prior to forming a redistribution layer (RDL). In some embodiments, a light to heat conversion layer (LTHC) 220 is sandwiched between glass carrier substrate 200 and polymer layer 210. LTHC 220 is an adhesive layer that can be cured with ultra-violet (UV) light to create a temporary bond between protective layer 210 and glass carrier substrate 200. This temporary bond can be broken to release polymer layer 210 from glass carrier substrate 200 once the INFO packaging is completed. By way of example and not limitation, irradiation of LTHC 220 with a focused laser beam through the back-side of glass carrier substrate 200 can generate sufficient heat to decompose LTHC 220 and release glass carrier substrate 200 from polymer layer 210. For a successful release, carrier substrate 200 is required to be transparent to a light source (e.g., a laser) that can irradiate and decompose LTHC 220.

Figure 3:
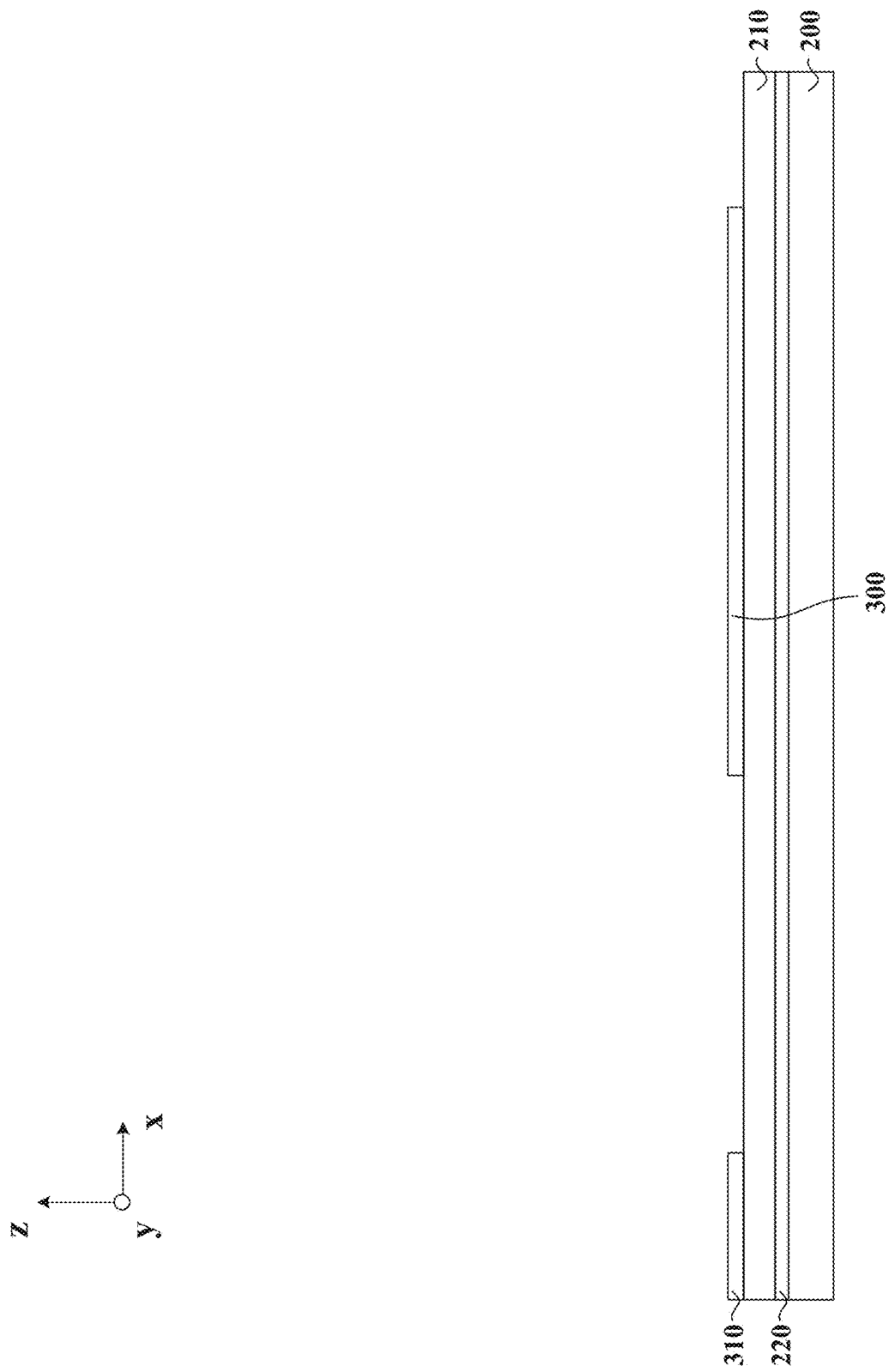

Referring to FIG. 1A, method 100 continues with operation 120 and the process of forming a bottom RDL on polymer layer 210. As shown in FIG. 3, the bottom RDL, may include metal lines 300 and 310. By way of example and not limitation, metal lines 300 and 310 are formed from patterned metal stacks that include an electroplated copper top layer, a copper seed middle layer, and a titanium bottom layer. The titanium bottom layer and the copper seed middle layer can be deposited with a physical vapor deposition (PVD) process at a thickness between about 100 nm and about 500 nm, respectively. The electroplated copper top layer may be formed at a thickness of about 7 μm. In some embodiments, the metal stack can be blanket deposited (e.g., deposited to cover the entire top surface of layer 210) and subsequently patterned with photolithography and etching operations to form metal lines 300 and 310. For example, a photoresist can be spin-coated over the metal stack and patterned so that openings are formed in the photoresist layer to expose areas of the metal stack. The exposed areas of the metal stack can be subsequently removed with a wet etching process. Areas of the metal stack covered by the photoresist can be protected and not removed by the wet etching chemistry. In other words, the photoresist acts as a wet etching mask. The wet etching chemistry can remove the exposed areas of the metal stack until the underlying polymer layer 210 is exposed. After the wet etching operation, the photoresist is removed leaving behind patterned areas of the metal stack, such as metal lines 300 and 310. In some embodiments, additional metal lines, like metal lines 300 and 310, can be formed throughout polymer layer 210. Therefore, the bottom RDL may not be limited to metal lines 300 and 310.

Referring to FIG. 1A, method 100 continues with operation 130 and the process of forming through interposer vias (TIVs) in contact with the bottom RDL (e.g., metal lines 300 and 310). In some embodiments, one or more of the TIVs formed during operation 130 can be used to define the surface areas of respective MIM capacitors, while one or more TIVs formed during operation 130 can be used as conductive structures that electrically connect various components of the packaging structure. By way of example and not limitation, the TIVs in operation 130 can be formed using photolithography and etching operations. For example, referring to FIG. 4A, a photoresist layer 400 with a thickness between about 180 μm and about 250 μm can be spin-coated over metal lines 300, 310 and polymer layer 210. Photoresist layer 400 can be subsequently patterned to form TIV openings 410, 420, and 430 to expose respective portions of metal lines 300 and 310 as shown in FIG. 4A.

Figure 4B:
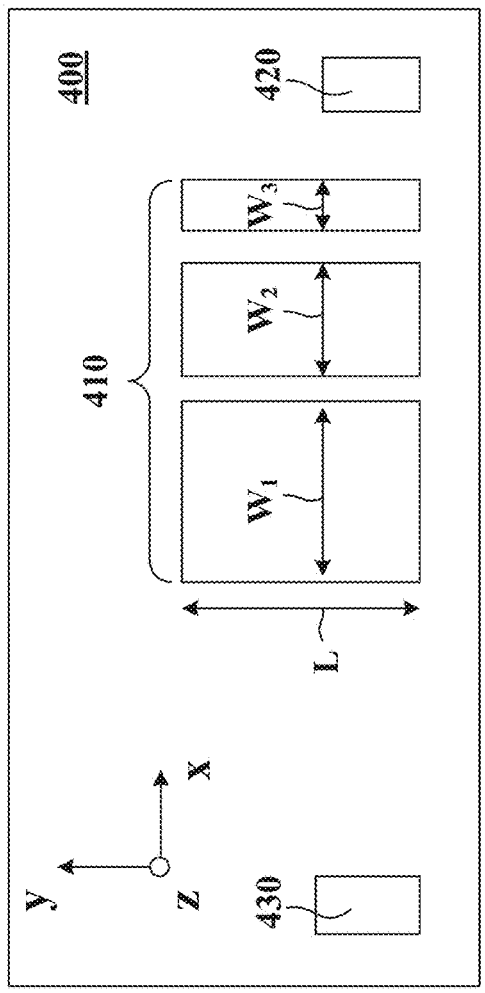

In some embodiments, TIV openings 410 are used to define the surface area of the formed MIM decoupling capacitors, while TIV openings 420 and 430 are used to form TIV structures that electrically connect various components of the packaging structure. TIV openings 410 may be designed to have different dimensions from TIV openings 420 and 430. For example, TIV openings 410 can have a width W and a length L that is different from respective widths and lengths of TIV openings 420 and 430 as shown in FIG. 4B, which is a top view of FIG. 4A. In some embodiments, TIV openings 410 can be formed to have the same length L but different width W to define MINI capacitors with different surface areas (W×L). In this case, W can be used to effectively modulate the surface area for each MIM capacitor. However, this is not limiting and both W and L can be independently defined for each TIV opening 410 to modify the surface area for each MIM capacitor. Changing W and L independently may provide additional design flexibility but increase fabrication complexity due to potential photolithography and etching limitations.

Figure 4A:
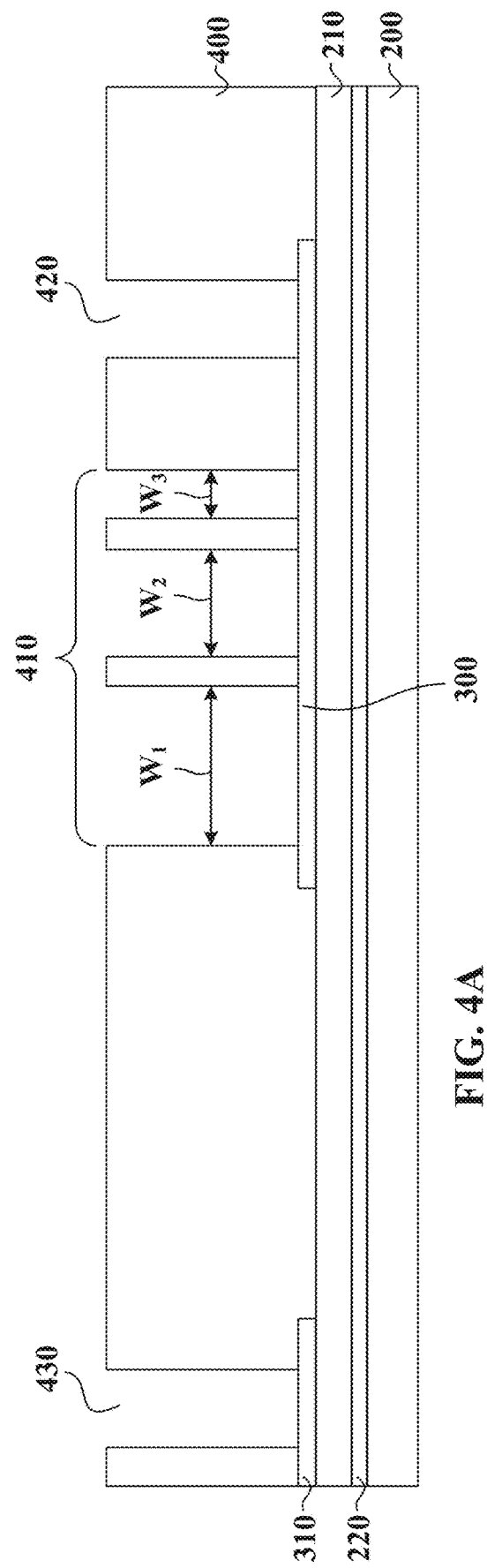

By way of example and not limitation, as shown in FIGS. 4A and 4B, $W_1$ can be greater than $W_2$, and $W_2$ can be greater than $W_3$. Alternatively, $W_2$ can be greater than $W_3$, and $W_3$ can be greater than $W_1$. The aforementioned width relationships are not limiting and additional width relationships are possible depending on the desired number of MIM capacitors and the resulting capacitance. Further, any number of TIV openings 410 can be formed with different or similar widths to $W_1$, $W_2$, and $W_3$. By way of example and not limitation, $W_1$ can be about 1000 μm, $W_2$ can be about 100 μm, and $W_3$ can be about 10 μm while TIV openings 420 and 430 can have widths of about 120 μm. Further, the shape of TIV openings 410 can be rectangular, elliptical, circular, or have any other suitable geometrical shape.

Figure 5:
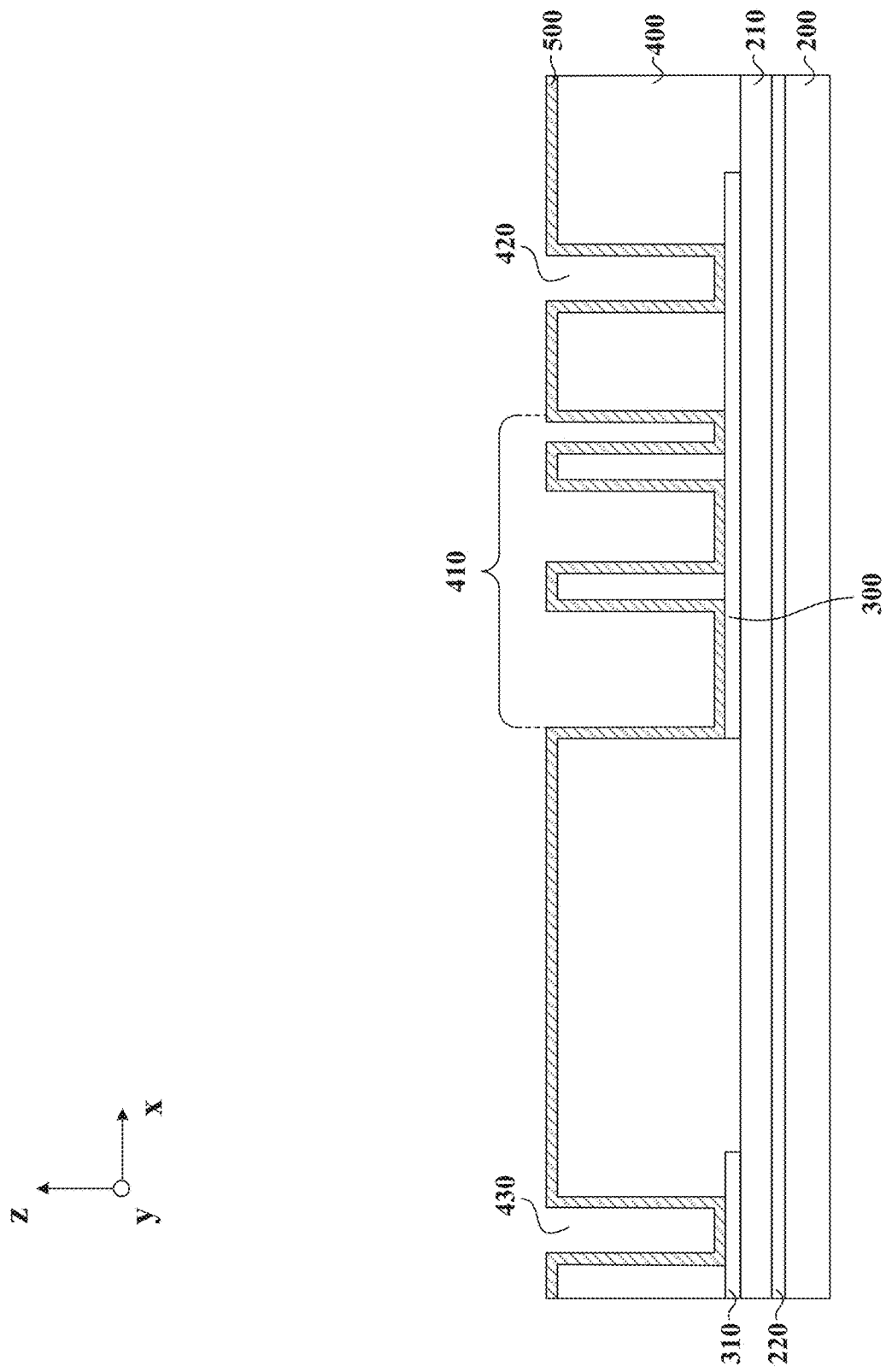
Figure 6:
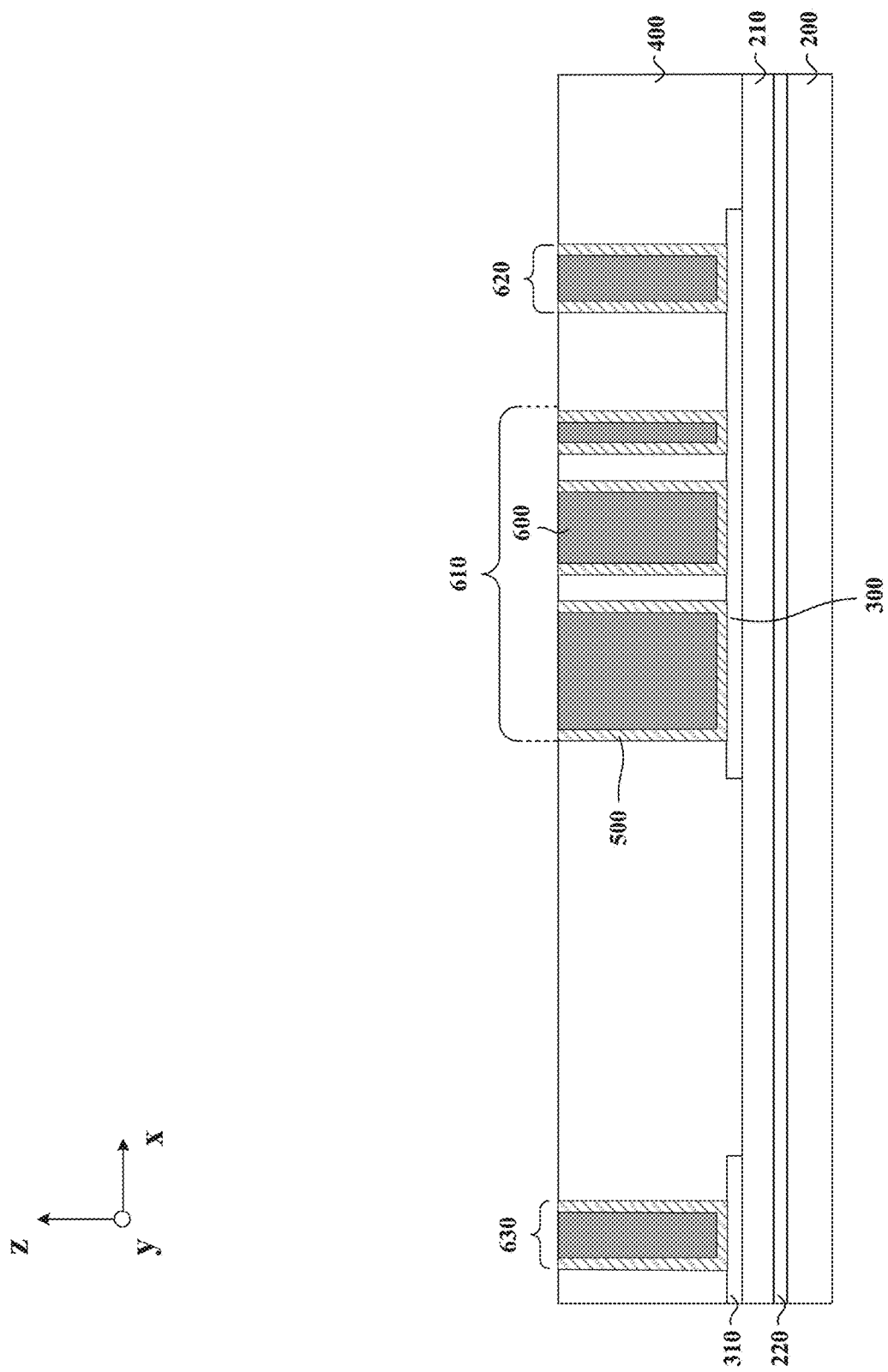

Referring to FIG. 5, a titanium and copper seed layer stack 500 is deposited (e.g., with a PVD process) over patterned photoresist layer 400 to cover the sidewalls and bottom surfaces of openings 410, 420, and 430. In some embodiments, seed layer stack 500 is deposited over photoresist layer 400, as shown in FIG. 5. In some embodiments, the titanium layer can be about 1000 Å and the copper seed layer can be about 5000 Å. In FIG. 6, a copper layer 600 is electroplated on the titanium and copper seed layer stack 500 to fill openings 410, 420, and 430 and form respective TIVs 610, 620, and 630. In some embodiments, the as-deposited copper layer 600 can grow over photoresist layer 400 on seed layer stack 500. Copper layer 600 can be subsequently planarized and polished with a chemical mechanical planarization (CMP) process to remove portions of copper layer 600 over the top surface of photoresist layer 400. In some embodiments, and during the copper CMP process, seed layer stack 500 is also removed from the top surface of photoresist layer 400 as shown in FIG. 6. The thickness of photoresist layer 400, which can range in some embodiments between about 180 µm to about 250 µm, defines the height of TIVs 610, 620, and 630 at this stage of the fabrication process.

Figure 7:
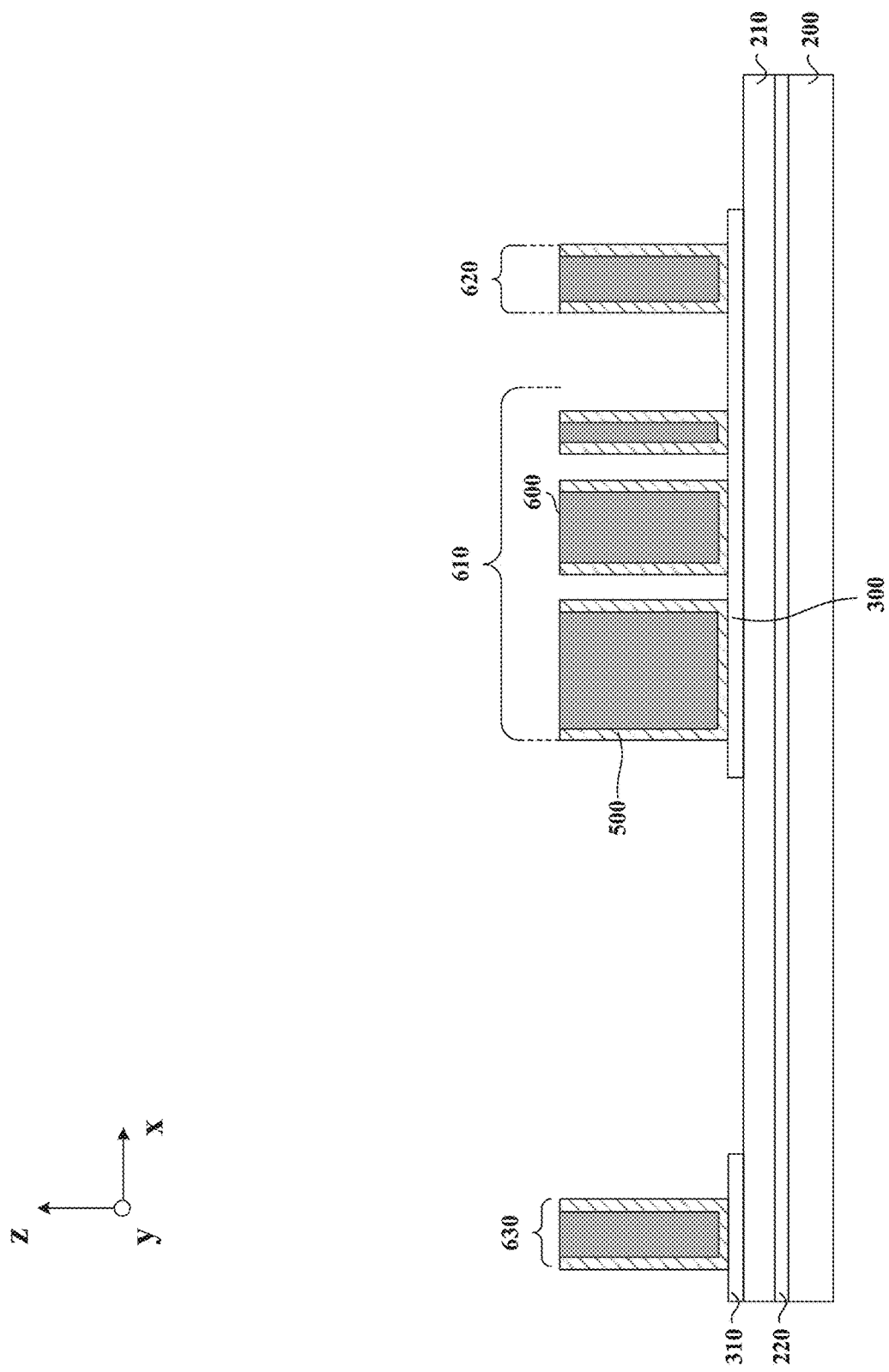

After forming TIVs 610, 620, and 630, photoresist layer 400 can be removed with a wet etching process as shown in FIG. 7. According to some embodiments, the resulting TIVs 610 have different widths compared to TIVs 620 and 630 as discussed above with reference to openings 410, 420, and 430 shown in FIGS. 4A and 4B. For example, TIVs 610 can have widths between about 10 µm and 1000 µm while TIVs 620 and 630 can have a width of about 120 µm. In some embodiments, widths $W_1$, $W_2$, and $W_3$ of TIV openings 410 shown in FIGS. 4A and 4B define the width of respective TIVs 610. In some embodiments, TIVs 610 are an integral part of MIM capacitor structures while TIVs 620 and 630 provide electrical connections between the layers of the InFO packaging.

Figure 8:
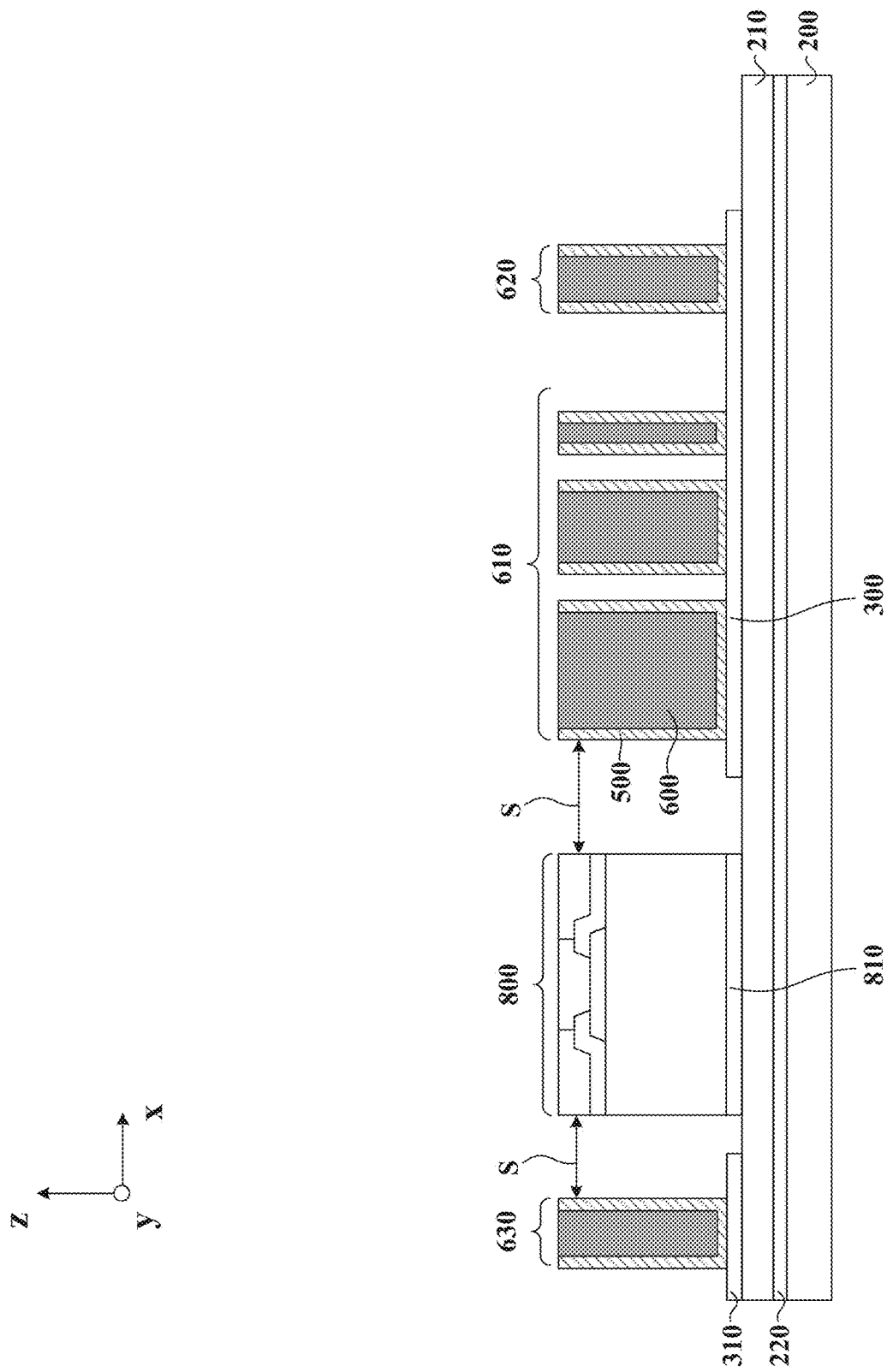

Referring to FIG. 1A, method 100 continues with operation 140 and the process of attaching a die 800 on polymer layer 210 as shown in FIG. 8. In some embodiments, die 800 may have, for example, radio frequency communications functionality (e.g., RF die), or may have other or additional functions. Die 800 may have been pre-fabricated using chip fabrication processes and may include a plurality of transistors and multiple interconnect layers configured to implement its functionality (e.g., RF communications). In some embodiments, a die attach film (DAF) 810 acts as a glue layer and is interposed between die 800 and polymer layer 210. By way of example and not limitation, DAF 810 can have a thickness between about 10 µm and about 20 µm. In some embodiments, DAF 810 is a dielectric. By way of example and not limitation, the height of die 800 may be comparable to that of TIVs 610, 620, and 630. If die 800 is taller than TIVs 610, 620, and 630, it can be recessed to the height of TIVs 610, 620, and 630. According to some embodiments, multiple dies may be attached to polymer layer 210 during operation 140. To avoid forming parasitic capacitances between the TIVs and die 800, a minimum spacing S between about 20 µm and 30 µm may be appropriate. Spacing S may be adjusted below about 20 µm if a material with sufficiently low dielectric constant (e.g., lower than about 2.8) can be used to isolate the TIVs and die 800.

Figure 9:
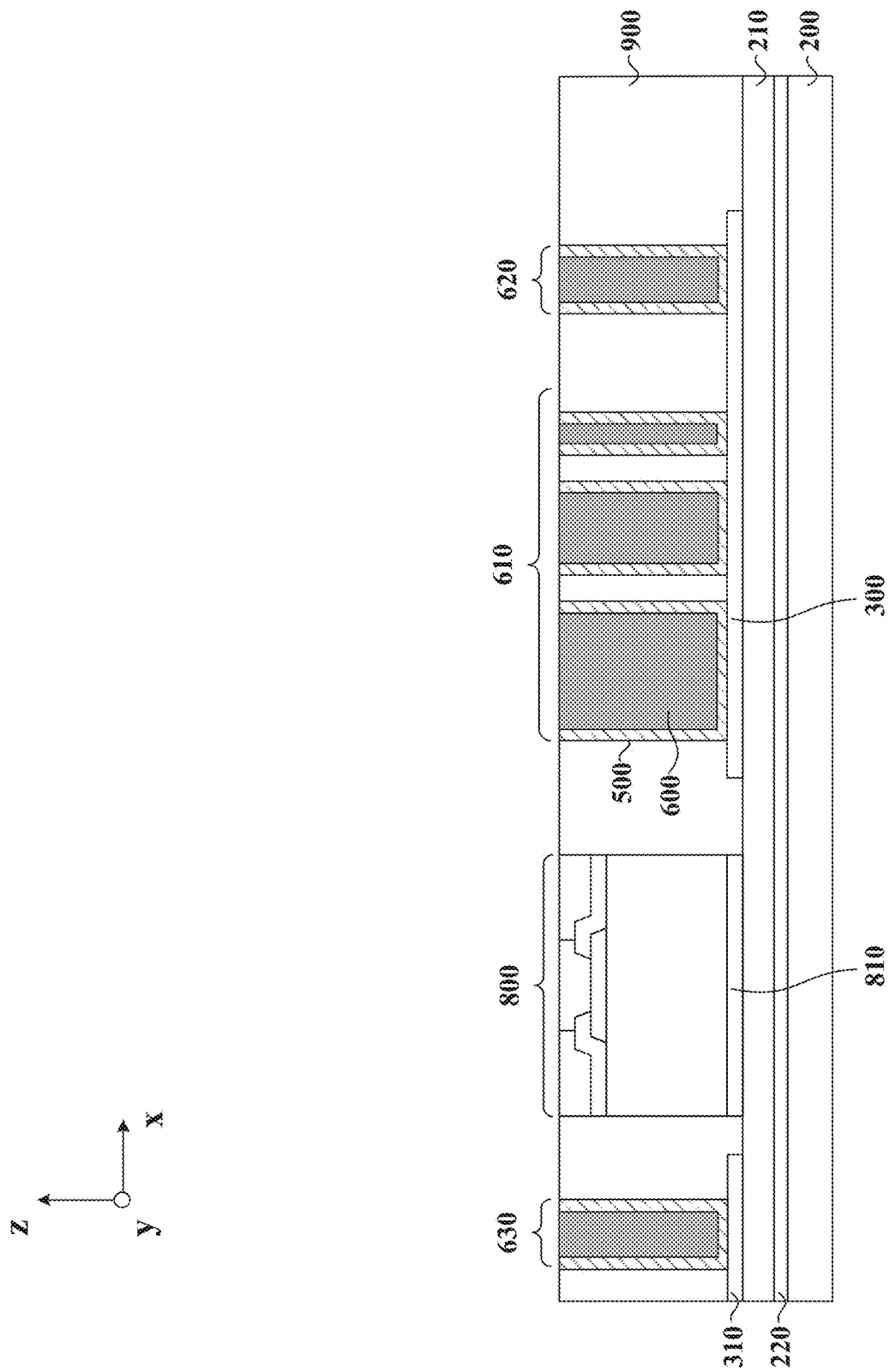

In referring to FIGS. 1A and 9, method 100 continues with operation 150 and the process of disposing a molding compound (MC) 900 on polymer layer 210 to surround die 800 and TIVs 610, 620, and 630. By way of example and not limitation, molding compound 900 can be spin-coated on polymer layer 210. According to some embodiments, molding compound 900 is an epoxy-based material that is a solid at room temperature and a liquid when heated at temperatures greater than 250° C. In some embodiments, molding compound 900 is melted before being spin-coated on polymer layer 210. According to some embodiments, die 800 and TIVs 610, 620, and 630 can be embedded in molding compound 900. By way of example and not limitation, the spin-coated molding compound can have a thickness between about 230 µm and about 300 µm. This means that the as-coated molding compound 900 can have an overburden of about 50 µm—for example, it may extend about 50 µm over the top surfaces of die 800 and TIVs 610, 620, and 630.

After the application of molding compound 900 on glass carrier substrate 200, molding compound 900 can be left to cool and harden. Once molding compound 900 hardens, it can be partially grinded so that about 98% of the 50 µm overburden is removed. The grinding process leaves the top surface of molding material compound 900 rough. According to some embodiments, a CMP process can be subsequently used to planarize, polish, and remove the remaining portion of molding compound 900 (e.g., about 1 µm, which is the remaining about 2% of the 50 µm overburden) until the top surfaces of die 800 and TIVs 610, 620, and 630 are exposed. In some embodiments, molding compound 900 provides structural support and electrical isolation to die 800 and TIVs 610, 620, and 630. Since molding compound 900 melts at temperatures greater than about 250° C., the thermal budget for any subsequent fabrication operations should be limited to about 250° C. If a molding compound with greater temperature tolerances is used, then the thermal budget of subsequent fabrication operations may increase provided that no other thermal budget limitations exist.

In referring to FIG. 1A, method 100 continues with operation 160 and the process of forming a high-k dielectric on molding compound 900, TIVs 610, 620, and 630, and die 800. In referring to FIG. 10, high-k dielectric 1010 is blanket deposited over molding compound 900, the TIVs (e.g., 610, 620, and 630), and die 800. In some embodiments, high-k dielectric 1010—when patterned—can form the dielectric of each MIM capacitor. In some embodiments, high-k dielectric 1010 is deposited at a temperature below about 250° C.—for example, at about 180° C. or about 210° C.—depending on the type of dielectric layer and the deposition method used. Additionally, the thickness of high-k dielectric 1010 can be greater than about 1 nm to avoid charge leakage and capacitance loss.

In some embodiments, high-k dielectric 1010 has a k-value greater than about 3.9 depending on the type of material. By way of example and not limitation, high-k dielectric 1010 can be a silicon nitride ($SiN_x$) film with a k-value of about 7, deposited with a plasma-enhanced chemical vapor deposition (PECVD) process at a deposition temperature of about 180° C. and with a thickness greater than about 30 nm. Alternatively, high-k dielectric 1010 can be silicon oxynitride ($SiON_x$) deposited with chemical vapor deposition (CVD), PECVD, atmospheric pressure CVD (APCVD), sub-atmospheric pressure CVD (SACVD), metal organic CVD (MOCVD), etc. In some embodiments, high-k dielectric 1010 can be a dielectric stack—which may include a bottom layer of zirconium oxide ($ZrO_2$), a middle layer of aluminum oxide ($Al_2O_3$), a top layer of $ZrO_2$—deposited at a temperature of about 210° C. having a k-value greater than about 13 (e.g., 13.6). In some embodiments, high-k dielectric 1010 can be a stack that includes hafnium-based dielectrics (e.g., hafnium oxide ($HFO_x$) and hafnium silicate ($HfSiO_x$)), titanium oxide ($TiO_2$), or tantalum oxide ($TaO_x$). High-k dielectric 1010 can also be a liquid phase high-k polymer, such as PBO or PI cured and hardened at temperatures below about 250° C. High-k dielectric 1010 can also be a spin on glass (SOG) or a liquid phase $SiO_2$ with a low curing temperature (e.g., below about 250° C.) and a k-value between about 4 and about 4.2. Additionally, high-k dielectric 1010 can be strontium oxide ($SrTiO_3$) with a k-value between 100 and 200, barium-titanium oxide ($BaTiO_3$) with a k-value of about 500, barium-strontium-titanium oxide ($BaSrTiO_3$) with a k-value of between about 250 and about 300, or lead-zirconium-titanium oxide ($PbZrTiO_3$) with a k-value between about 1000 and about 1500.

In some embodiments, high-k dielectric 1010 can be deposited by a PVD, CVD, PECVD, APCVD, SACVD, MOCVD, or other suitable CVD-based deposition process that can deposit the above-noted dielectric materials at deposition temperatures below about 250° C. (e.g., at about 180° C. or about 210° C.). Alternatively, in some embodiments, high-k dielectric 1010 can be spin-coated at a temperature below about 250° C. (e.g., at about 180° C. or about 210° C.).

According to some embodiments, thicker dielectrics featuring a higher k-value can provide comparable capacitance to thinner dielectrics featuring a lower k-value. This can be advantageous when leakage through the dielectric is a concern. Further, materials having higher k-values increase the capacitance value of an MIM capacitor according to the parallel plate capacitance formula:

$$C = k\varepsilon_o \frac{A}{d}$$

where C is the capacitance of the MIM capacitor, k is the dielectric constant of the high-k dielectric in the MIM capacitor (e.g., the dielectric constant of high-k dielectric 1010), $\varepsilon_0$ is the dielectric constant of free space, A is effective surface area of the capacitor, and d is the thickness of the high-k dielectric material (e.g., the thickness of high-k dielectric 1010).

In referring to FIG. 1B, method 100 continues with operation 170 and the process of depositing a metal layer on high-k dielectric 1010. For example, referring to FIG. 10, a metal layer 1020 is deposited as a blanket film on high-k dielectric 1010. In some embodiments, metal layer 1020— when patterned—forms a top metal plate of an MIM capacitor. Metal layer 1020, similar to metal lines 300 and 310, is a metal stack made of an electroplated copper top layer, a copper seed middle layer, and a titanium bottom layer. The titanium bottom layer and the copper seed middle layer can be deposited with a PVD process at a thickness between about 100 nm and about 500 nm, respectively. The electroplated copper top layer can have a thickness of about 7 µm.

Figure 10:
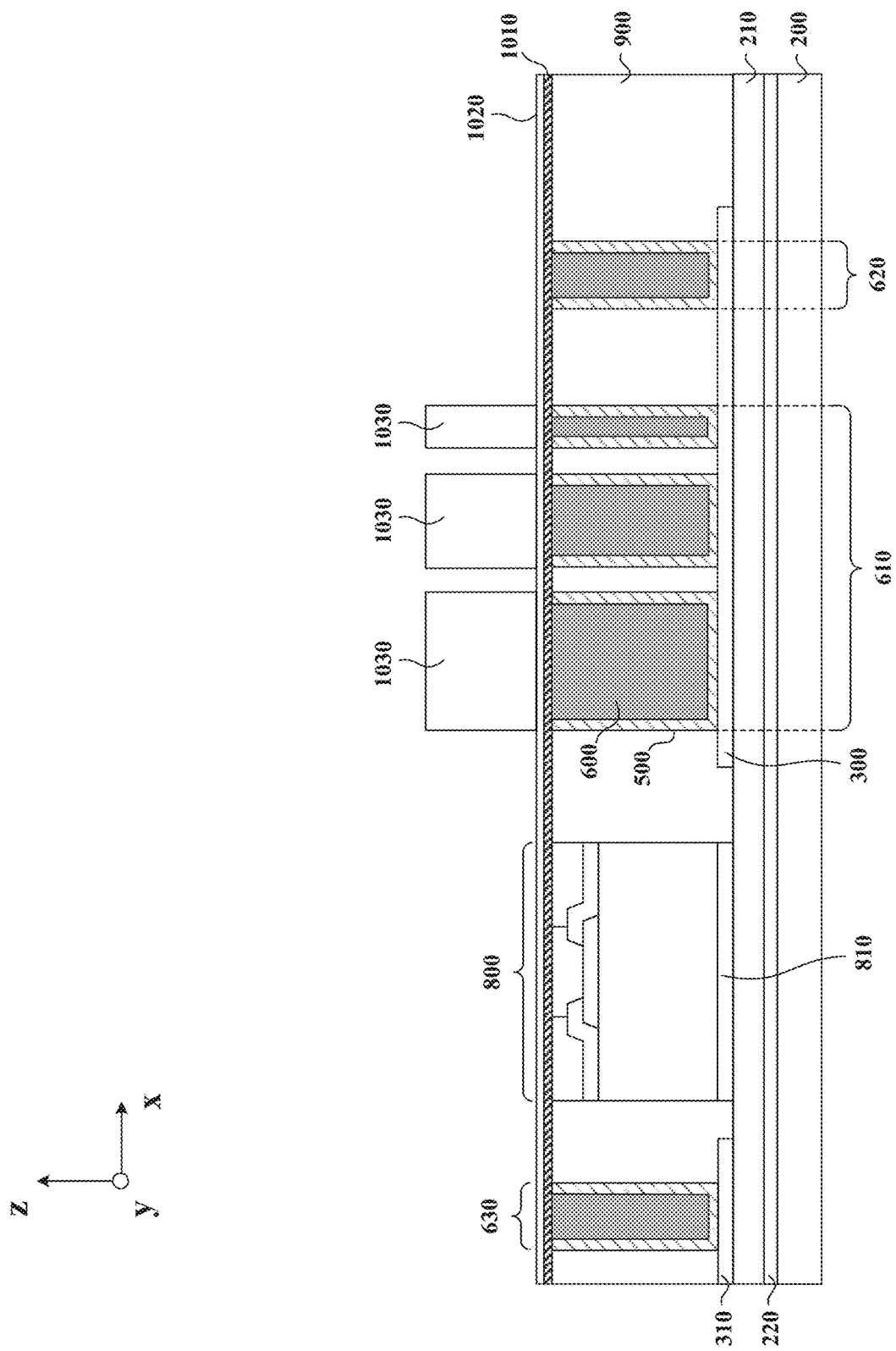
Figure 11:
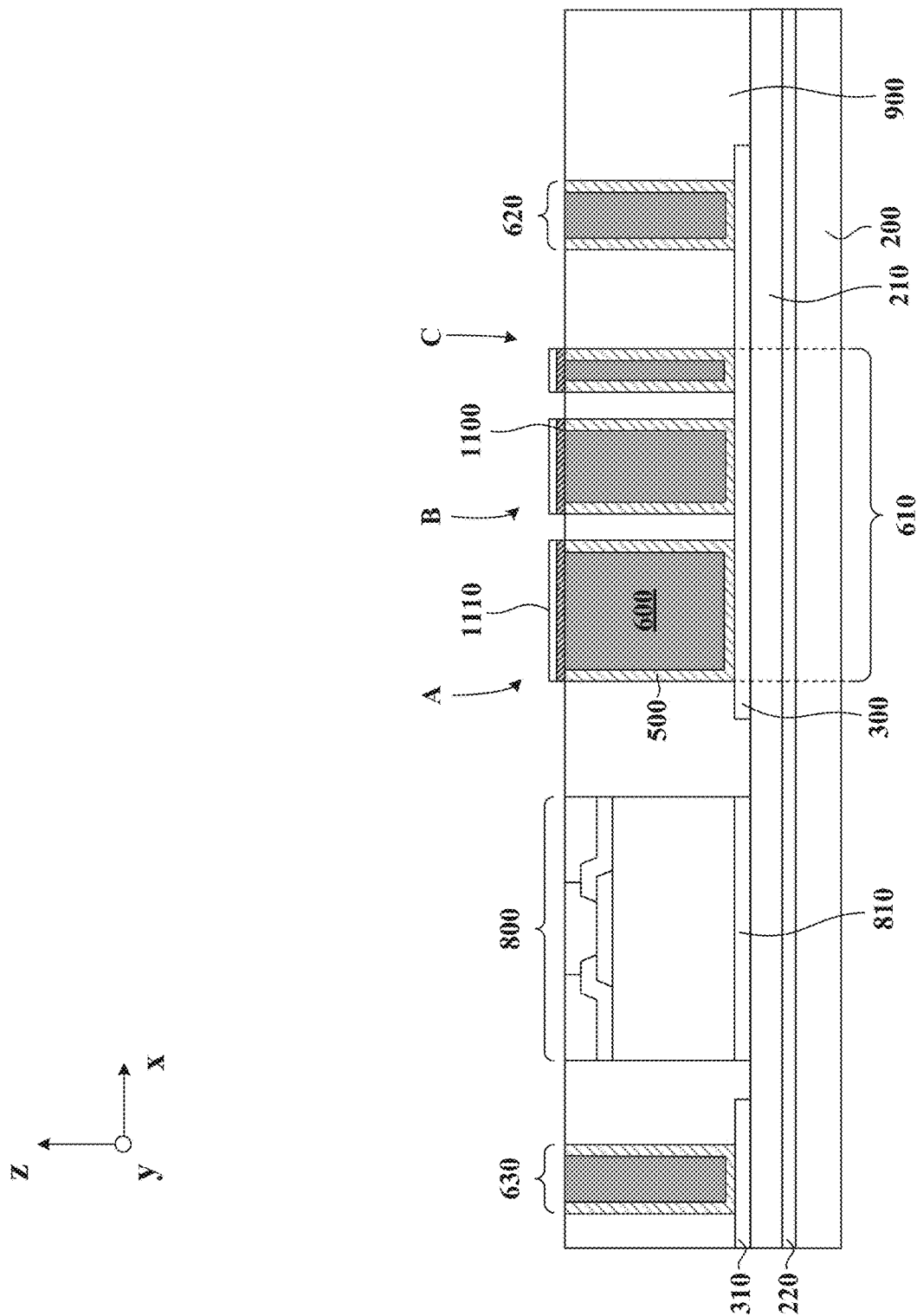

In referring to FIG. 1B, method 100 continues with operation 180 and the process of patterning metal layer 1020 and high-k dielectric 1010 to form MIM capacitor structures according to some embodiments. In some embodiments, metal layer 1020 and high-k dielectric are patterned successively. In some embodiments, patterning of metal layer 1020 and high-k dielectric 1010 can be accomplished with photolithography and etching operations. For example, as shown in FIG. 10, a photoresist can be spin-coated over the metal stack and subsequently patterned so that photoresist patterns 1030 are formed over each TIV 610. Each photoresist pattern 1030 is substantially aligned to a top surface of each TIV 610. A wet etching process can remove portions of metal layer 1020 not covered by photoresist patterns 1030, and a subsequent dry etching process can remove portions of high-k dielectric 1010 not covered by photoresist patterns 1030. FIG. 11 shows the resulting patterned dielectric layer 1100 and metal layer 1110 after the removal of photoresist patterns 1030. According to some embodiments, patterned dielectric layer 1100, patterned metal layer 1110, and TIVs 610 form MIM capacitors A, B, and C. In some embodiments, MIM capacitors A, B, and C are decoupling capacitors that suppress voltage spikes from respective power supplies they are connected to.

By way of example and not limitation, the capacitance of MIM capacitor A can be in the nF range (e.g., about 100 nF), the capacitance of the MIM capacitor B can be in the pF range (e.g., 100 pF), and the capacitance of the MIM capacitor C can be in the fF range (e.g., 100 fF). The capacitance value of each MIM capacitor A, B, and C is defined by its respective surface area since the high-k dielectric material and high-k dielectric thickness can be common between MIM capacitors A, B, and C. Further, assuming that the length of each MIM capacitor A, B, and C along the y-axis is substantially similar, the width of each MIM capacitor along the x-axis defines the capacitance value according to the parallel plate capacitance formula. As discussed above, the width of each MIM capacitor can be defined via opening widths $W_1$, $W_2$, and $W_3$ of TIV openings 410 shown in FIGS. 4A and 4B. Therefore, opening widths $W_1$, $W_2$, and $W_3$ of TIV openings 410 can correspond to respective widths of the formed MIM capacitors A, B, and C.

A large range of capacitances can be achieved by varying (i) the width of each capacitor (and therefore the area of each MIM capacitor), (ii) the material type of the high-k dielectric, and (iii) the thickness of the high-k dielectric. For example, MIM capacitors can be formed with capacitances ranging from the fF range (e.g., $10^{-15}$ Farad) to the nF range (e.g., $10^{-9}$ Farad). Therefore, MIM capacitors suitable for electrical components with different capacitance requirements can be provided. For example, using method 100, MIM capacitors suitable for RF antennas and power management can be integrated into a single InFO 3D IC packaging structure.

According to some embodiments, FIGS. 16A-16F show various shapes for MIM capacitors A, B, and C formed with method 100. In the examples of FIGS. 16A-16F, MIM capacitors with different width W and length L combinations are shown. These variations are exemplary and not limiting. Other shapes for MIM capacitors A, B, and C are possible as shown in FIGS. 17A-17F. The examples of MIM capacitors shown in FIGS. 16A-F and 17A-F are exemplary and not limiting. Therefore, MIM capacitors A, B, and C can be shaped in any number of ways to achieve the desired capacitor area and capacitance value. In some embodiments, a plurality of MIM capacitors with different capacitance values can be formed concurrently in a packaging structure (e.g., an InFO packaging) depending on the capacitance requirements. By way of example and not limitation, any combination of MIM capacitors shown in FIGS. 16A-F and 17A-F can be formed in the packaging structure.

Referring to FIG. 1B, method 100 continues with operation 190 and the process of forming one or more RDLs to provide electrical connections to MIM capacitors A, B, and C. During operation 190, electrical connections to other elements and TIVs can be formed. For example, electrical connections to die 800 and TIVs 620 and 630 can also be completed during operation 190.

By way of example and not limitation, each additional RDL can include a new polymer layer. For example, referring to FIG. 12, a polymer layer 1200—which is similar to polymer layer 210—is disposed on molding compound 900. In some embodiments, polymer layer 1200 is a low-k dielectric material with a k-value of about 2.8 and a thickness of about 4.5 μm. Polymer layer 1200 can be subsequently patterned to form openings therein where the RDL metal lines will be formed. For example, in FIG. 12, a first RDL 1210 can be formed on TIVs 620 and 630, die 800, and MIM capacitors A, B, and C. The alignment of first RDL 1210 with TIVs 620 and 630, die 800, and MIM capacitors A, B, and C can be achieved with one or more photolithography and etching operations. By way of example and not limitation, a photoresist layer can be spin-coated over polymer layer 1200. The photoresist layer can be patterned so that openings aligned to TIVs 620 and 630, die 800, and MIM capacitors A, B, and C can be formed in the photoresist layer. A subsequent etching process can remove the portions of polymer layer 1200 not masked by the photoresist to form openings substantially aligned to TIVs 620 and 630, die 800, and MIM capacitors A, B, and C. Once the openings in polymer layer 1200 have been formed, the photoresist layer can be removed and a blanket metal stack can be deposited and patterned to form metal lines 1220 of first RDL 1210.

Figure 12:
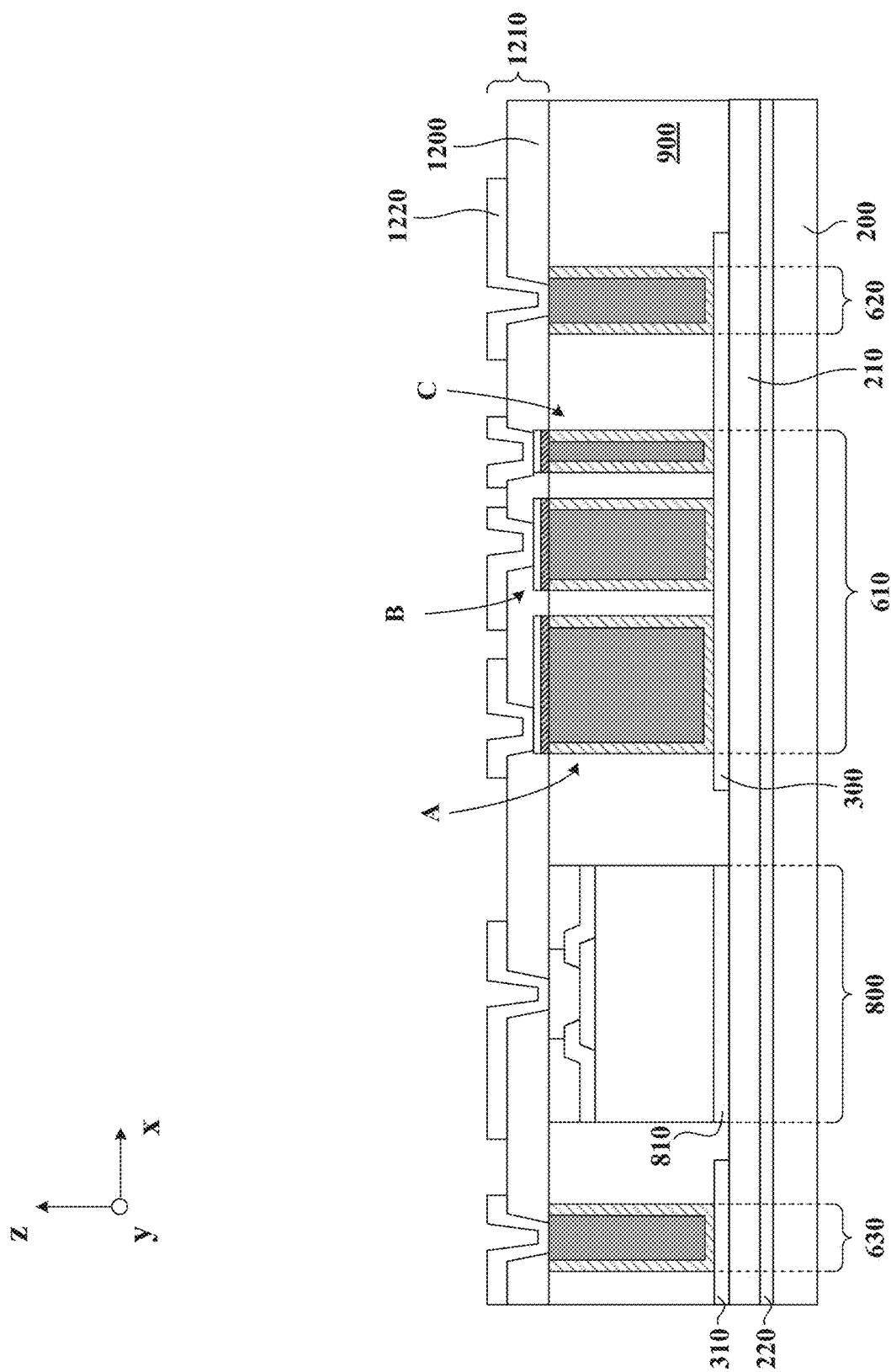

Metal lines 1220, similarly to metal lines 300, can include a metal stack of electroplated copper top layer, a copper seed middle layer, and a titanium bottom layer. By way of example and not limitation, the titanium bottom layer and the copper seed middle layer can be deposited with a PVD process at a thickness of about 100 nm and 500 nm, respectively. The electroplated copper top layer can have a thickness of about 7 μm or thicker. In some embodiments, the metal stack may partially fill the openings in polymer layer 1200 as shown in FIG. 12.

Figure 13:
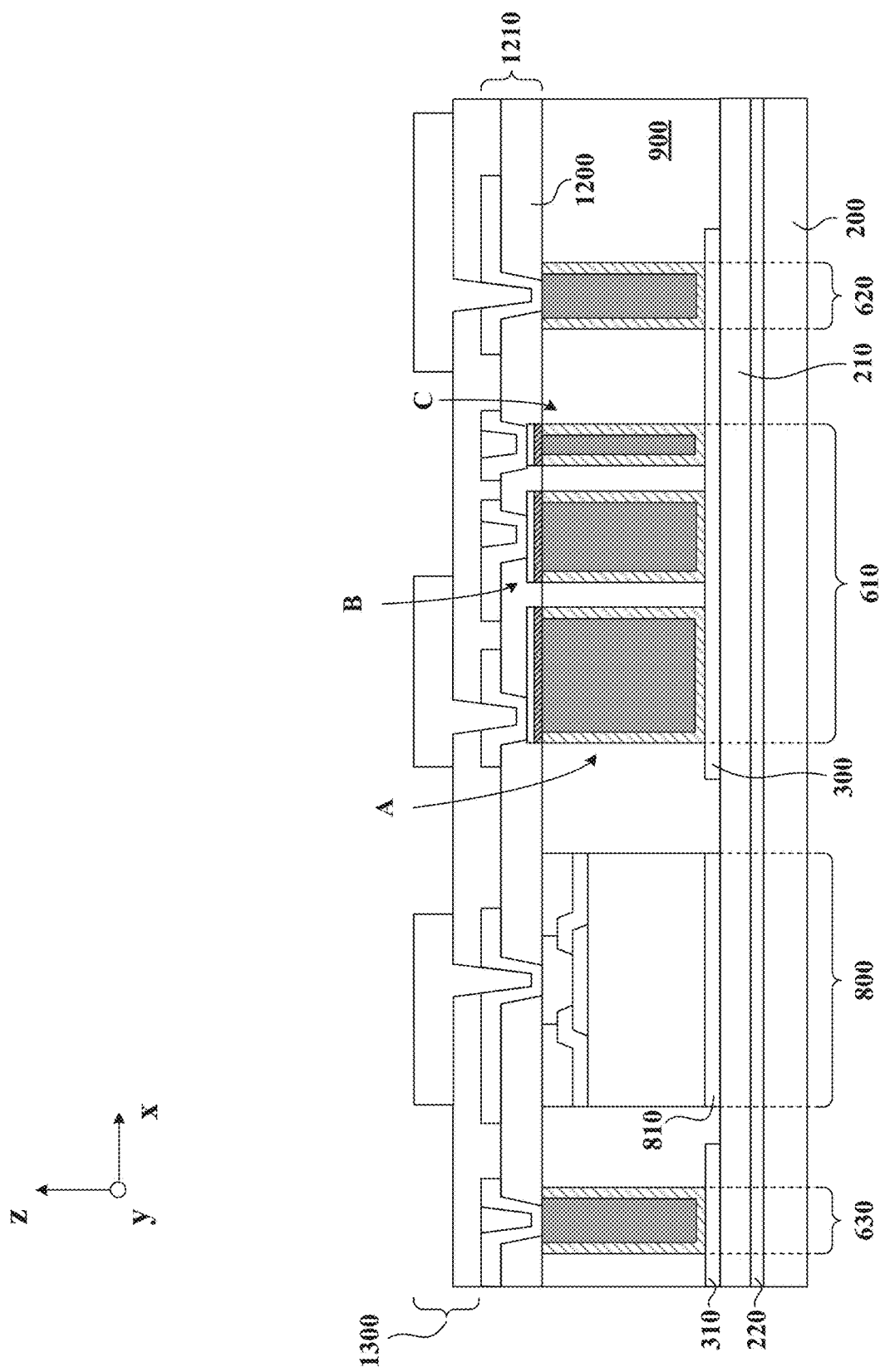
Figure 14:
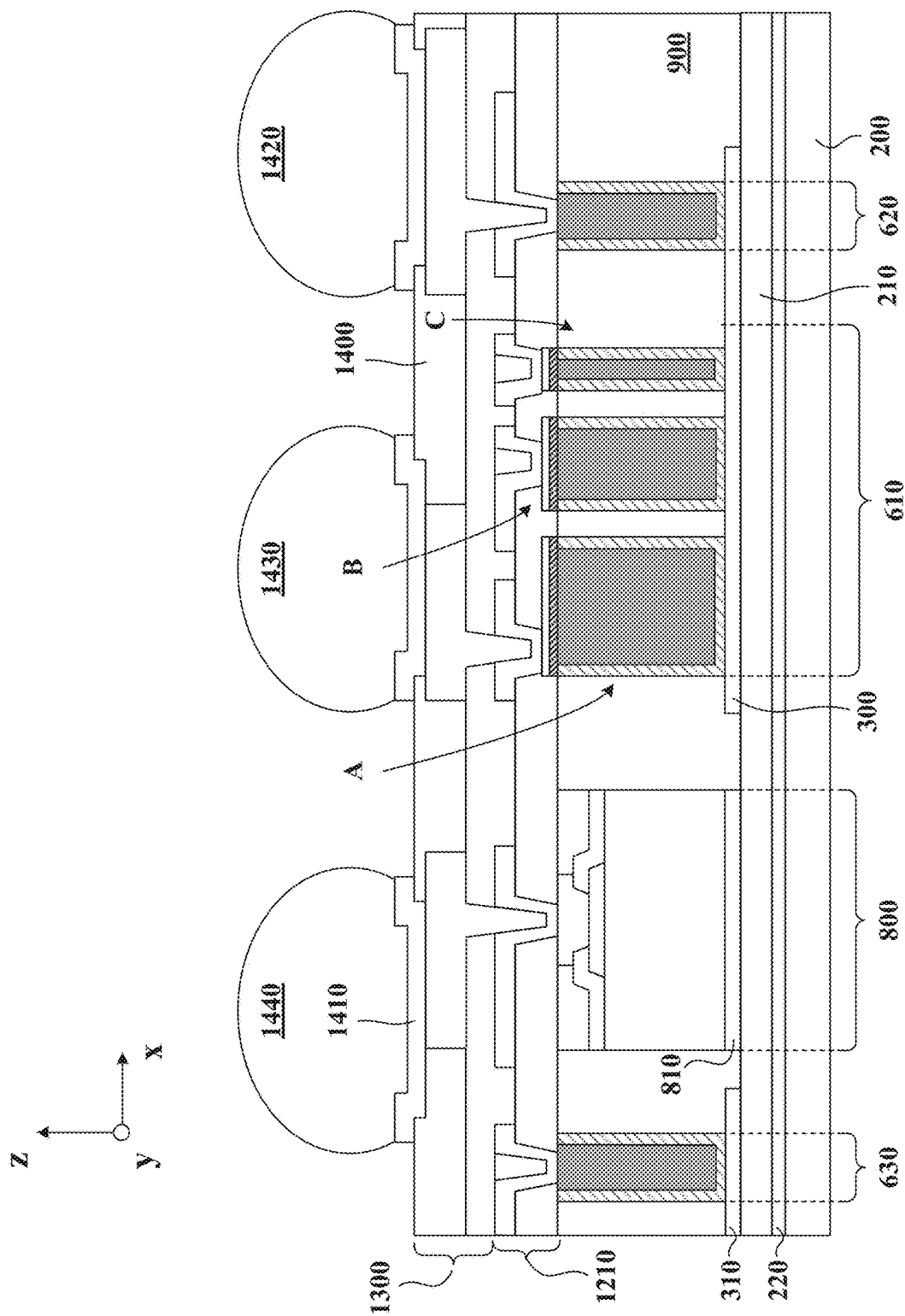

The above operation can be successively repeated to form a second RDL 1300, as shown in FIG. 13. The number of RDL levels provided herein is exemplary and should not be considered limiting. Therefore, fewer or additional RDL levels may be formed depending on the InFO packaging design. By way of example and not limitation, four or more RDLs can be formed over MIM capacitors A, B, and C. In referring to FIG. 14, and once all the RDLs have been formed, a top polymer layer 1400 is disposed over the topmost RDL (e.g., second RDL 1300 in FIG. 14), and subsequently patterned. According to some embodiments, a metal deposition followed by a patterning operation forms under bump metallurgy (UBM) contacts 1410. UBM contacts 1410 form an interface between RDL 1300 and solder bumps 1420, 1430, and 1440. In some embodiments, UBM contacts 1410 can include a metal stack of electroplated copper top layer, a copper seed middle layer, and a titanium bottom layer. Alternatively, UBM contacts 1410 can include an alloy such as titanium (Ti) and copper (Cu), titanium (Ti)-tungsten (W) and copper (Cu), aluminum (Al)-nickel (Ni)-vanadium (V) and copper (Cu), or chromium (Cr) and copper (Cu). Solder bumps 1420, 1430, and 1440 can be part of a ball grid array (BGA) and can be made of a metal alloy that may contain tin (Sn), silver (Ag) and copper (Cu), or a metal alloy that may contain lead (Pb) and tin (Sn).

In some embodiments, glass carrier substrate 200 can be detached (released) from polymer layer 210. For example, irradiating LTHC 220 with a focused laser beam through the back-side of glass carrier substrate 200 can generate sufficient heat to decompose LTHC 220 and release glass carrier substrate 200 from polymer layer 210. In some embodiments, polymer layer 210 acts as a backside protective layer for the InFO packaging.

Figure 15:
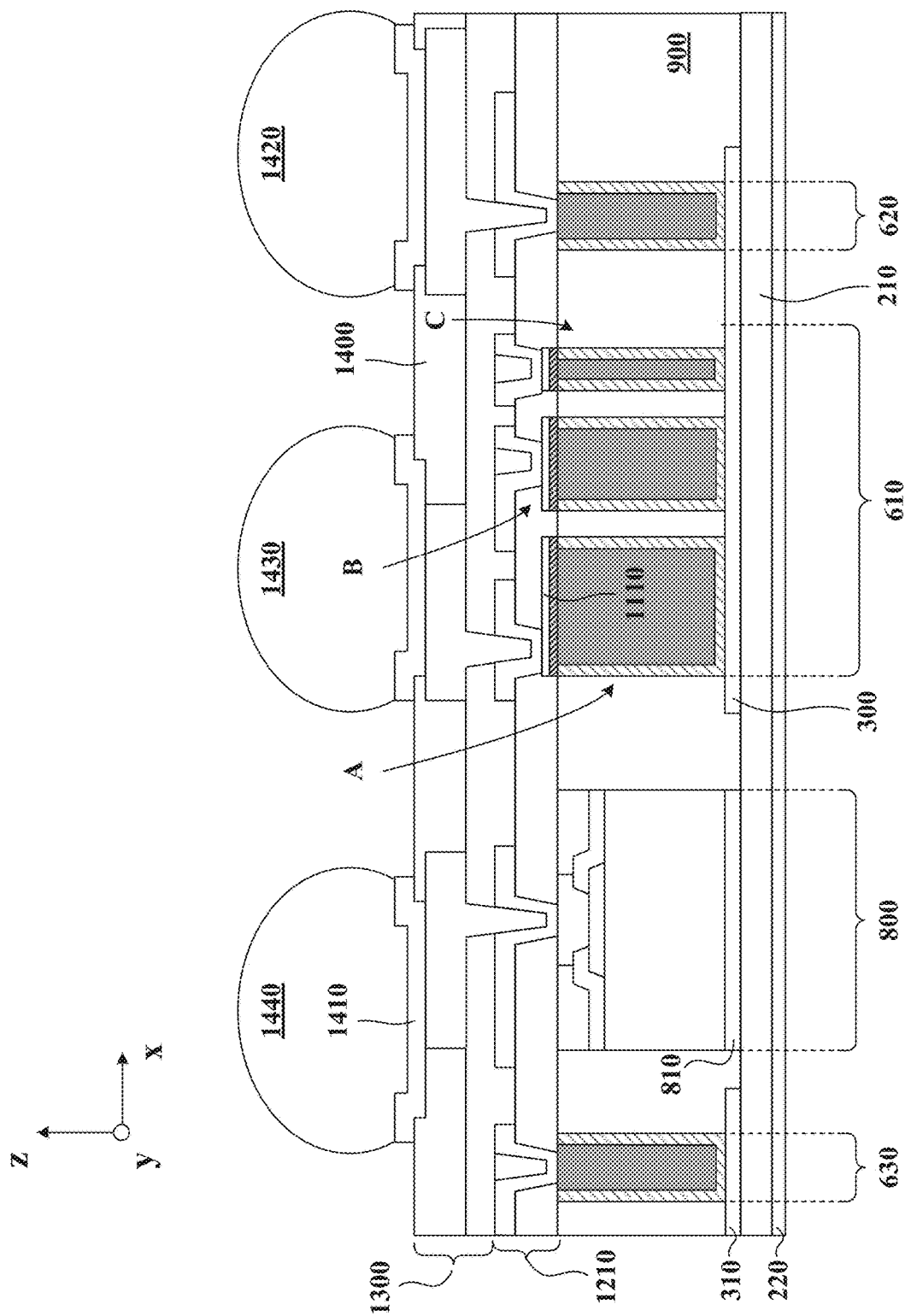
Figure 17C:
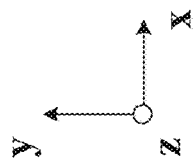
Figure 17C:
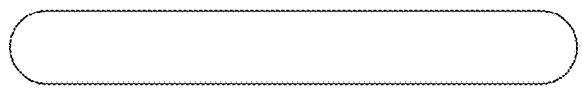
Figure 17F:
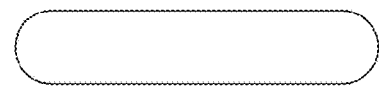
Figure 17B:
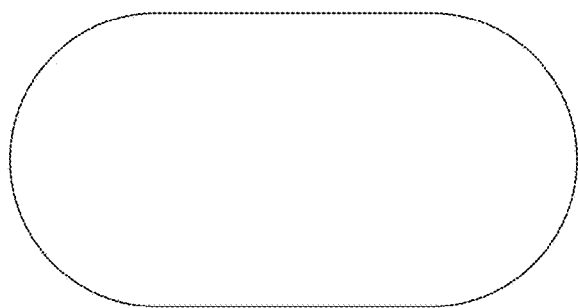
Figure 17E:
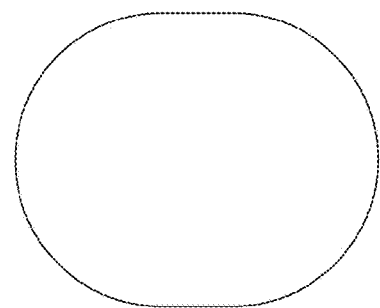
Figure 17A:
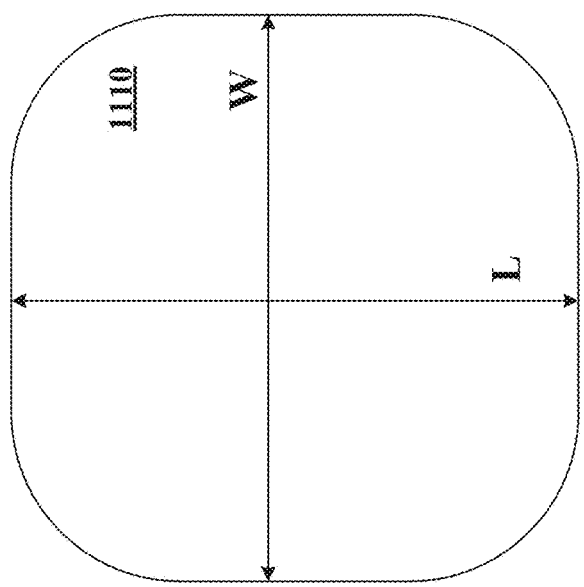
Figure 17D:
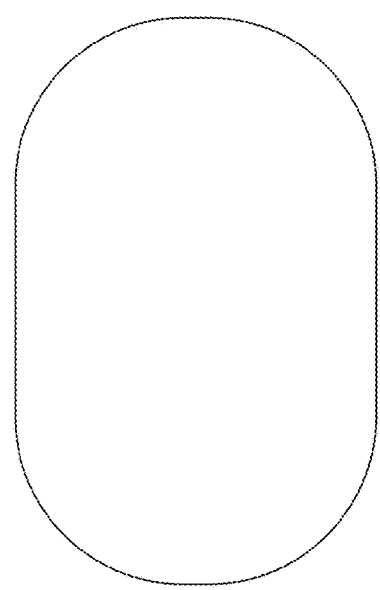

In some embodiments, solder bump 1420—which is electrically connected to line 300 through TIV 620—can be connected to an external ground connection, and solder bump 1430—which is electrically connected to MIM capacitor A—can be electrically coupled to an external power supply through metal layer 1110 of MIM capacitor A. In some embodiments, MIM capacitor A is a decoupling capacitor that suppresses voltage spikes from the external power supply it connects to. Accordingly, capacitors B and C can be coupled to the same or to a different external power supply through solder bumps not shown in FIG. 15. For example, electrical connections to metal layer 1110 of MIM decoupling capacitors B and C can be formed at locations along the y-axis not visible in FIG. 15 (e.g., into the page). In some embodiments, additional solder bumps, like solder bump 1430, not shown in FIG. 15, are electrically coupled to MIM decoupling capacitors B and C. In some embodiments, solder bump 1440—which is electrically connected to die 800—can be electrically connected to an external IC that provides input and power signals to die 800. Further, the number of solder bumps shown in FIG. 15 is not limiting. Therefore additional solder bumps are within the spirit and the scope of this disclosure.

According to some embodiments, solder bumps, like solder bumps 1420, 1430, and 1440 can electrically connect the InFO packaging to one or more external power supplies or to a ground connection. An external power supply is, for example, a power supply which is not integrated into the InFO packaging. For example, the InFO packaging with MIM capacitors A, B, and C can be attached through solder bumps 1420, 1430, and 1440 to a die or a printed circuit board (PCB) with solder bumps receptors. MIM capacitors A, B, and C can be used by internal or external components of InFO packaging.

The present disclosure is directed to a method for forming MIM decoupling capacitors with scalable capacitance. The MIM decoupling capacitors described herein can be integrated (or embedded) into 3D IC packaging, such as a CoWoS or an InFO packaging. In some embodiments, the MIM capacitors described herein feature high-k dielectric materials and have different shapes and sizes. For example, a large range of capacitances can be achieved by adjusting (i) the area of each MIM capacitor, (ii) the material type of the high-k dielectric, and (iii) the thickness of the high-k dielectric. In some embodiments, MIM capacitors can be formed with capacitances ranging from the fF range (e.g., $10^{-15}$ Farad) to the nF range (e.g., $10^{-9}$ Farad). Therefore, MIM capacitors suitable for electrical components with different capacitance requirements can be integrated into a packaging structure (e.g., a single 3D IC).

In some embodiments, a method includes depositing a polymer layer on a carrier substrate and forming first and second capacitor structures on the polymer layer. Forming the first and second capacitor structures includes forming a first redistribution layer with metal lines on a portion of the polymer layer, depositing a photoresist layer on the first redistribution layer, and etching the photoresist layer to form spaced apart first and second TIV openings in the photoresist layer that expose respective portions of a metal line of the redistribution layer and where the first TIV opening is wider than the second TIV opening. Forming the first and second capacitor structures further includes depositing a metal in the first and second TIV openings to form respective first and second TIV structures in contact with the metal line, removing the photoresist layer, forming a high-k dielectric on a top surface of the first and second TIV structures, and depositing a metal layer on the high-k dielectric layer to form respective first and second capacitors. Further, the method includes forming a second redistribution layer on the first and second capacitors.

In some embodiments, an interpose structure includes a polymer layer, a first redistribution layer on the polymer layer, and spaced apart capacitor structures with different surface areas over the first redistribution layer. Each of the spaced apart capacitor structures includes a TIV in contact with the first redistribution layer, where a surface area of the capacitor structure is based on a length and a width of the TIV; a dielectric material covering a top surface of the TIV, where the dielectric material is separated from sidewalls of the ITV and the first redistribution layer; and a top metal layer on the dielectric material. The interposer structure further includes a die attached on the polymer layer and adjacent to the spaced apart capacitor structures; a molding compound disposed between the die and each of the spaced apart capacitor structures; and a second redistribution layer disposed on the die and the spaced apart capacitor structures.

In some embodiments, a structure includes a first redistribution layer with solder bumps and an interposer structure configured to electrically connect to the first redistribution layer. The interposer structure includes capacitor structures, where each capacitor structure includes a TIV configured to electrically couple to the first redistribution layer, a high-k dielectric on the TIV, and a metal layer on the high-k dielectric. The structure further includes one or more dies and a molding compound surrounding the one or more dies and the capacitor structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an interconnect structure on a substrate;
   forming a through interposer via (TIV) structure on the interconnect structure;
   attaching a die to the substrate and adjacent to the TIV structure;
   forming a dielectric layer on a top surface of the TIV structure;
   forming a metal layer on a top surface of the dielectric layer;
   patterning the metal layer to form a side surface of the metal layer coplanar with a side surface of the TIV structure; and
   forming a redistribution layer (RDL) on the die and the metal layer.

2. The method of claim 1, wherein the substrate comprises a protective layer comprising a polyimide (PI), a polybenzoxazole (PBO), and combinations thereof, and wherein forming the interconnect structure comprises forming metal lines on the protective layer.

3. The method of claim 1, wherein forming the TIV structure comprises:
   forming a TIV structure opening in a photoresist layer;
   depositing a seed layer in the TIV structure opening;
   forming a metal fill layer on the seed layer; and
   removing the photoresist layer.

4. The method of claim 1, further comprising forming an other TIV structure with an area different from an area of the TIV structure.

5. The method of claim 4, further comprising:
   forming an other dielectric layer on a top surface of the other TIV structure; and
   forming an other metal layer on a top surface of the other dielectric layer.

6. The method of claim 1, wherein the die comprises a radio frequency communications functionality, and wherein attaching the die to the substrate comprises forming a die attach film (DAF) between the substrate and the die.

7. The method of claim 1, further comprising filling a space between the die and the TIV structure with a molding compound.

8. The method of claim 1, wherein forming the dielectric layer comprises forming a high-k dielectric layer with a dielectric constant greater than about 3.9.

9. The method of claim 1, wherein forming the RDL comprises:
   forming a polymer layer on the die and the metal layer; and
   forming metal lines on the polymer layer.

10. The method of claim 1, further comprising:
    forming one or more other RDLs on the RDL;
    forming under bump metallization (UBM) contacts on the one or more other RDLs; and
    forming solder bumps on the UBM contacts.

11. A method, comprising:
    forming a metal line on a protective layer;
    forming a first through interposer via (TIV) structure with a first area and a second TIV structure with a second area, different from the first area, on the metal line;
    attaching a die to the protective layer and adjacent to the first and second TIV structures with a die attach film (DAF);
    forming a first dielectric layer above the first TIV structure and a second dielectric layer above the second TIV structure, wherein a width of the first dielectric layer is the same as a width of the first TIV structure;
    forming a first metal layer above the first dielectric layer and a second metal layer above the second dielectric layer; and
    forming a redistribution layer (RDL) on the die and the first and second metal layers.

12. The method of claim 11, wherein forming the first and second TIV structures comprises:
    forming a first TIV structure opening and a second TIV structure opening in a photoresist layer;
    depositing seed layers in the first and second TIV structure openings;
    forming metal fill layers on the seed layers; and
    removing the photoresist layer.

13. The method of claim 11, wherein forming the first and second dielectric layers comprises:
    depositing a high-k dielectric layer with a dielectric constant greater than about 3.9 on the die and the first and second TIV structures; and
    removing portions of the high-k dielectric layer.

14. The method of claim 11, wherein forming the first and second metal layers comprises:
   forming a conductive metal layer on the first and second dielectric layers; and
   removing portions of the conductive metal layer.

15. The method of claim 11, wherein forming the first and second metal layers comprises:
   depositing a titanium (Ti) bottom layer;
   depositing a copper (Cu) seed layer; and
   electroplating a Cu top layer.

16. The method of claim 11, further comprising filling a space between the die and the first TIV structure and between the first and second TIV structures with a molding compound.

17. A method, comprising:
   forming an interconnect structure on a substrate;
   forming a through interposer via (TIV) structure, comprising:
      forming a TIV structure opening in a photoresist layer spin coated on the interconnect structure;
      depositing a seed layer in the TIV structure opening;
      forming a metal fill layer on the seed layer; and
      removing the photoresist layer;
   attaching a die to the substrate and adjacent to the TIV structure;
   forming a dielectric layer on a top surface of the TIV structure;
   forming a metal layer on a top surface of the dielectric layer; and
   patterning the dielectric layer and the metal layer to align edges of the dielectric layer and the metal layer with side surfaces of the TIV structure.

18. The method of claim 17, further comprising:
   forming an other TIV structure with an area different from an area of the TIV structure;
   forming an other dielectric layer on a top surface of the other TIV structure; and
   forming an other metal layer on a top surface of the other dielectric layer.

19. The method of claim 17, wherein forming the dielectric layer and the metal layer comprises:
   depositing a high-k dielectric layer with a dielectric constant greater than about 3.9 on the die and the TIV structure;
   forming a conductive metal layer on the high-k dielectric layer; and
   removing portions of the high-k dielectric layer and portions of the conductive metal layer.

20. The method of claim 17, further comprising:
   forming one or more redistribution layers (RDLs) on the die and the metal layer;
   forming under bump metallization (UBM) contacts on the one or more RDLs; and
   forming solder bumps on the UBM contacts.

* * * * *